United States Patent
Leloup et al.

(10) Patent No.: US 8,578,851 B2
(45) Date of Patent: Nov. 12, 2013

(54) METHOD OF PREPARING PRINTING FORMS FOR FLEXOGRAPHIC PRINTING AND A SYSTEM USED IN THE METHOD

(75) Inventors: Laurent Leloup, Genarp (SE); Stefan Kraft, Lund (SE)

(73) Assignee: Tetra Laval Holdings & Finance S.A., Pully (CH)

( * ) Notice: Subject to any disclaimer, the term of this patent is extended or adjusted under 35 U.S.C. 154(b) by 584 days.

(21) Appl. No.: 12/745,173

(22) PCT Filed: Dec. 9, 2008

(86) PCT No.: PCT/SE2008/000689
§ 371 (c)(1),
(2), (4) Date: May 27, 2010

(87) PCT Pub. No.: WO2009/078780
PCT Pub. Date: Jun. 25, 2009

(65) Prior Publication Data
US 2010/0307361 A1    Dec. 9, 2010

(30) Foreign Application Priority Data
Dec. 17, 2007   (SE) ..................................... 0702805

(51) Int. Cl.
*B41F 27/12* (2006.01)
*B41C 1/18* (2006.01)

(52) U.S. Cl.
USPC ....................... 101/401.1; 101/477

(58) Field of Classification Search
USPC .............................. 101/401.1, 477
See application file for complete search history.

(56) References Cited

U.S. PATENT DOCUMENTS

| | | | |
|---|---|---|---|
| 5,006,042 A * | 4/1991 | Park ........................... | 414/795.4 |
| 5,386,268 A * | 1/1995 | Ohlig et al. ..................... | 355/70 |
| 6,112,663 A | 9/2000 | Ulrich et al. | |
| 2004/0129157 A1 | 7/2004 | Dewitte | |
| 2004/0187721 A1 * | 9/2004 | Salvestro ................... | 101/463.1 |
| 2004/0255806 A1 * | 12/2004 | Klein et al. ................... | 101/477 |
| 2005/0139109 A1 * | 6/2005 | Plasswich et al. ............ | 101/477 |

FOREIGN PATENT DOCUMENTS

| | | |
|---|---|---|
| EP | 1 473 153 A2 | 11/2004 |
| EP | 1 543 966 A1 | 6/2005 |
| WO | WO 00/49463 A1 | 8/2000 |

OTHER PUBLICATIONS

International Search Report (PCT/ISA/210) issued on Mar. 16, 2009 by the Swedish Patent Office in Its capacity as the International Searching Authority in International Application No. PCT/SE2008/000689.

* cited by examiner

Primary Examiner — Leslie J Evanisko
(74) Attorney, Agent, or Firm — Buchanan Ingersoll & Rooney PC

(57) ABSTRACT

A method and a system of preparing a flexographic printing form, and a preparation table used in the method and system, involves placing printing plates in a plate magazine and delivering the printing plates in a predetermined order from the plate magazine to the preparation table. The printing plates are transported by a transporter, such as a conveyor belt, on the preparation table and further to a printing sleeve or a printing cylinder. During transportation, the printing plates are exposed on the backsides to a light source. The printing sleeve is rotated with a speed adapted to the speed of the transporter in such a way that the printing plates are placed staggered in two or more lanes on the printing sleeve. The printing plates placed on the printing sleeve are then imaged, e.g. by laser ablation.

30 Claims, 2 Drawing Sheets

METHOD OF PREPARING PRINTING FORMS FOR FLEXOGRAPHIC PRINTING AND A SYSTEM USED IN THE METHOD

TECHNICAL FIELD

The present invention concerns a method of preparing a flexographic printing form, as well as a system for use in the method. It also concerns a table for preparation of printing plates used in the method.

PRIOR ART

Especially in printing of paperboard, intended for liquid carton packaging, according to the continuous form-fill and seal principle, wherein a tube of a web-formed material is longitudinally sealed and filled, and subsequently transversally sealed and divided into individual packages at high speed, the demands on the register accuracy and alignment of the printed décor are very high. If the printed décor is not accurately positioned on the packaging laminate, the packaging process may result in a number of defect packages. Generally, in flexographic printing, which is a preferred printing method today for printing of liquid packaging board, normally a number of individual flexible printing plates are placed on a printing sleeve or directly on a printing cylinder (impression cylinder). It is common practice to place already imaged printing plates on a printing sleeve with the help of a mounting machine. To assure a proper printing register the plates must be carefully aligned and mounted in register. The mounting machine is assisting the operator in manually positioning, in a specified correct position, the individual printing plates on the sleeve or directly on an impression cylinder. Such a mounting machine comprises a printing sleeve holder, a small table for manual handling of the printing plates and a camera system to aid in the accurate positioning of the plates.

In an alternative method POS (Plate On Sleeve), usually one single blank, i.e. un-imaged and un-processed, printing plate is mounted on a printing sleeve or printing cylinder, which single printing plate is covering the printing sleeve or cylinder surface. Then the sleeve with the blank printing plate is imaged using a computer-to-plate (CtP) imaging device. This technique provides a much better register holding and alignment compared to the above mentioned conventional plate mounting with mounting machine, since no manual operator interference takes place.

However, such a process is less flexible, as it does not allow for mounting and separately changing the different printing lanes on the sleeve or the impression cylinder. The width of one lane may correspond, for example, to the width of one package, and to the width of a web of packaging material entering the filling machine for continuous packaging. Thus, sections or lanes cannot be changed individually. When changing printing pattern on only one or a few of the lanes or sections, the whole POS printing plate has to be removed and replaced by a new one. As a result of this, more plate material is wasted than in the conventional mounting method of multiple plates.

Most importantly, however, the manual mounting by skilled mounting personnel, is tedious and time-consuming and requires educated and well-trained operators for performing the task.

SUMMARY OF THE INVENTION

In order to avoid the problems with manual mounting and registering of the printing plates and to tackle the disadvantages of the POS technique, a new method for preparing the flexographic printing form has been developed. In this method a new system including a special preparation table is used. By rearranging the normal workflow for preparing and positioning of printing plates for mounting onto a printing sleeve or printing cylinder and use a new system including a specially developed preparation table a number of advantages are achieved.

If printing sleeves are used they are placed on printing cylinders in a final stage, which printing cylinders are then placed in the printing press. Sometimes no printing sleeves are used, in which case the printing plates are placed directly on the printing cylinders. For ease of description the term "printing sleeve" is normally used in this description but it should be construed as "printing sleeve or printing cylinder", if it is not apparent that it only refers to a printing sleeve.

Because the plates are imaged after being placed on the printing sleeve or cylinder the tolerance for the distances between the plates, to secure proper register, is less stringent compared to mounting of already imaged plates on the sleeve by conventional plate mounting. The printing plates are normally slightly larger than needed in order to allow for the less stringent placing of the plates on the printing sleeve. Afterwards the plates mounted on the printing sleeve will be imaged by an imaging device, which means that exact register of the print pattern is secured. A person skilled in the art realises that the exact type of the imager is of no importance for the present invention as such, but preferably the imager may be a CtP imager, which preferably uses laser imaging and has integrated main exposure to UV-light.

As the plates are positioned non-imaged on the sleeve the tolerances in positioning the plates are less stringent than if imaged plates are manually mounted on a sleeve. The plates are automatically positioned in approximate register on the preparation table and automatically transferred and fixed onto the printing sleeve or cylinder, while maintaining said approximate register positions, which means that there is no manual moment involved. With no manual involvement the skill of the operator is no more a limiting factor.

One object of the present invention is to keep the flexibility of using several printing plates, making it possible to vary the printing pattern in only one or some of the several lanes (co-print). This advantage is neither obtained by the POS technique nor by the well known "seamless sleeve" technology. Another object is to speed up the time for preparing printing forms, i.e. printing sleeves or printing cylinders furnished with printing plates. By the use of the system of the present invention a workflow has been developed greatly reducing the time needed to prepare the printing form. The time-sayings have been estimated to about 60%.

According to the present invention the general workflow is based on a number of steps performed in the following order:
   pre-cut blank printing plates are stacked,
   either the printing plates are automatically taken from the stacks and placed on a preparation table for preparing and positioning before fixing onto a printing sleeve or a printing cylinder and the printing plates are then subjected to back exposure on the preparation table, or the printing plates are subjected to back exposure in the stacks,
   the printing plates are automatically transferred and fixed onto the printing sleeve or printing cylinder,
   the printing sleeve or printing cylinder with the printing plates is brought to an imager with integrated main exposure, and
   the printing sleeve or printing cylinder with the printing plates is round processed.

Preferably, the cut printing plates are placed in a plate magazine and the printing plates are delivered onto a preparation table, and are then delivered in a predetermined order, adapted to the intended placement of the printing plates on the printing sleeve. The printing plates are preferably transported by a transportation means across the preparation table and further to the printing sleeve. One preferred example of such transportation means is a conveyor belt for carrying the printing plates across the table. Other examples of transportation means are a lifting mechanism by e.g. vacuum suction cups onto and from the table, a pulling/pushing mechanism for the plates to slide across the table or a step-wise movement mechanism of the table surface, or of course, any combination of transportation mechanisms that work in a reliable way. The upper part of the preparation table may thus be a conveyor belt, such that the printing plates are delivered directly onto the conveyor belt from the plate magazine.

While transported across the preparation table, the printing plates pass a light source for back exposure, which light source is placed below the printing plates on the preparation table. In the case of a conveyor belt as the transportation means, the light source may be placed below a part of the conveyor belt carrying the printing plates.

Preferably, the printing plates are brought from the preparation table to the printing sleeve by a transportation means of the preparation table, while the printing sleeve is rotated with a speed adapted to the speed of the transportation means, for example a conveyor belt, in such a way that the printing plates are placed in register in predetermined positions on the printing sleeve, and wherein the printing plates are placed staggered in two or more lanes on the printing sleeve.

Preferably, the printing plates are fixed onto the printing sleeve using a tape being adhesive on both sides or sleeves with an adhesive surface.

According to a preferred embodiment of the invention, the step of imaging the printing sleeve includes laser ablation to create a negative of the printing pattern and subsequent exposure of the negative to UV light, and preferably, the step of round processing of the printing sleeve includes at least washing and drying.

Further objects and advantages of the method of the present invention will be obvious to a person skilled in the art reading the detailed description below of at present preferred embodiments.

BRIEF DESCRIPTION OF THE DRAWINGS

The invention will be described further below by way of example and with reference to the enclosed drawings. In the drawings.

DETAILED DESCRIPTION OF PREFERRED EMBODIMENTS

According to the present invention a method of preparing flexographic printing forms has been developed. The method is based on the use of a new system including a specially developed preparation table 1.

According to the present invention a preparation device is furnished, which may be realized in different ways. In a first embodiment the preparation device comprises a plate magazine, a preparation table, including a conveyor band and means for back exposure, and a sleeve. The preparation device of a second embodiment comprises a plate magazine, transportation means, a preparation table, including means for back exposure, and a sleeve. In a third embodiment the preparation device comprises a plate magazine, including means for back exposure, transportation means and a sleeve.

Figure 1:
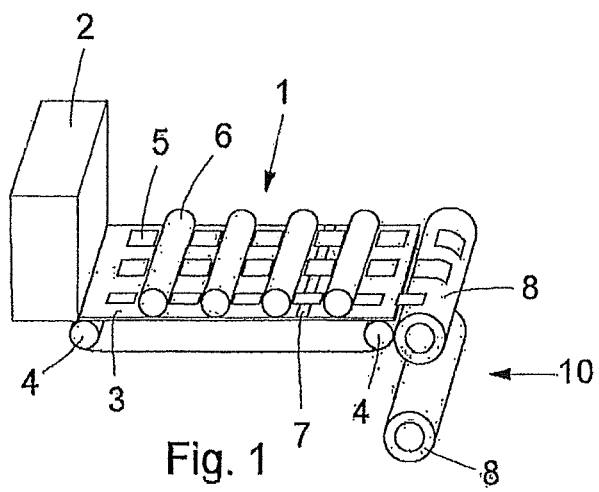
FIG. 1 is a principal view of a preparation table according to the present invention.
Figure 2:
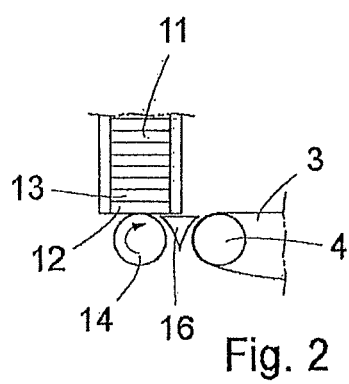
FIG. 2 is a detail view of a part of the preparation table of FIG. 1.
Figure 3:
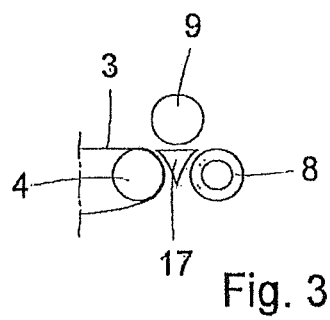
FIG. 3 is a detail view of another part of the preparation table of FIG. 1.
Figure 4:
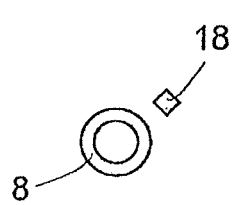
FIG. 4 is a side view illustrating an imager.
Figure 5:
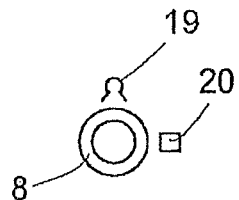
FIG. 5 is a side view illustrating a cleaning device.

In FIGS. 1-3 an example of a first embodiment of the present invention is shown. The method of the present invention involves the following general workflow as seen in the first embodiment. A number of pre-cut printing plates 5 are fed with predetermined intervals onto a conveyor belt 3 of the preparation table 1. The conveyor belt 3 brings the printing plates 5 from the one, upstream, end of the preparation table 1 to the other, downstream, end. During transportation the back of each printing plate 5 is exposed to light, as is well known in the prior art. From the conveyor belt 3 the printing plates 5 with said back exposure are automatically transferred and fixed onto a printing sleeve 8. The sleeve 8 is then brought to a CtS device (Computer-to-Sleeve) for imaging and integrated main exposure. After the main exposure the printing plates 5 on the sleeve 8 are round processed in a normal way, by washing, drying and possible further final processing.

At one end of the preparation table 1 of FIG. 1 a plate magazine 2 is placed. Cut printing plates 5 are placed in the plate magazine 2, which plates 5 are not yet exposed. The exact size of the cut printing plates 5 may vary depending on the actual printing to be done, which in turn depends on the size of the packages to be produced. The plate magazine 2 has a number of compartments and associated feeding mechanisms adapted to the number of lanes to be printed in the printing machine. Thus, the printing plates 5 are placed in a number of stacks 11 inside the plate magazine 2. The plate magazine 2 has means for controlled deliverance of the printing plates 5. The plates 5 are fed out onto a conveyor in the form of a conveyor belt 3 and rollers 4, forming the top of the transportation means. A person skilled in the art realises that the mechanism for feeding out plates 5 from the plate magazine may have many different designs, e.g. pushing or pulling mechanisms or lifting mechanisms. One example of the feeding is indicated in FIG. 2. Here the lowermost plate 12 of one stack 11 is gripped from below by a roll 14 by means of friction and fed out below a mechanical stop hindering the plate 13 above the lowermost plate 12 to be feed out together with the lowermost plate 12. To assist in the transfer of the lowermost plate 12 from the magazine 2 to the conveyor belt 3 a guide bar 16 is arranged between the plate magazine 2 and the end of the conveyor. The plates 5 are fed out in a staggered way, which is a commonly known method to avoid excess vibration of the sleeves or cylinders during printing. Above the conveyor belt 3 a number of stabilizing rollers 6 are placed, which rollers 6 are to keep the plates 5 in their proper position on the conveyor belt 3. Thus, there is contact between the stabilizing rollers 6 and the printing plates 5.

The printing plates 5 are fed onto the conveyor belt 3 positioned in the way they are to be positioned on the printing sleeve 8. Thus, the printing plates 5 are automatically placed on the conveyor belt 3 in the correct positions for the imaging to be performed. As the printing plates 5 are imaged at a later state the tolerance when placing the printing plates 5 on the conveyor belt is less stringent compared to if already imaged printing plates 5 were mounted. Positioning of the printing plates 5 involves both the distances between the printing plates 5 and that the printing plates 5 are in register, i.e. positioned to give the desired printing pattern.

Below the conveyor belt 3 a light source 7 is placed, which light source 7 exposes the backside of the printing plates 5. The light source is often a UV light source, in the form of a light bulb or a fluorescent tube. A person skilled in the art realises that the light source may be of many different types. In one example diodes placed in a line or a frame is used. Back exposure is a necessary step in preparing printing plates 5 for flexographic printing.

By controlling the speed of the conveyor belt 3 it is possible to control the time for back exposure.

At the end of the preparation table 1, which end is opposite to the plate magazine 2, the printing plates 5 are transferred and fixed onto a printing sleeve 8. By synchronizing a rotational speed of the printing sleeve 8 to the speed of the conveyor belt 3 the printing plates 5 are placed on the sleeve 8, with the same order and relative position as on the conveyor belt 3. To assist in the transfer from the conveyor belt 3 to the printing sleeve 8 e.g. a guide bar 17 is placed between the conveyor belt 3 and printing sleeve 8 to bridge the distance between said parts. In some cases a feeding roller 9 is placed above the transfer area to assist in the transfer. The guide bar 17 and the feeding roller 9 are indicated in FIG. 3. A person skilled in the art realises that the transfer may be arranged also in other ways. Depending on the type of printing sleeve (self adhesive, not self adhesive) 8 an appropriate adhesive is required, by which the printing plates 5 are fixed to the printing sleeves 8. A tape having adhesive on both sides may provide the adhesion and fixation. The printing plates 5 are normally received on a backing layer on the printing sleeve 8 or the backside of the printing sleeve 8.

Figure 6:
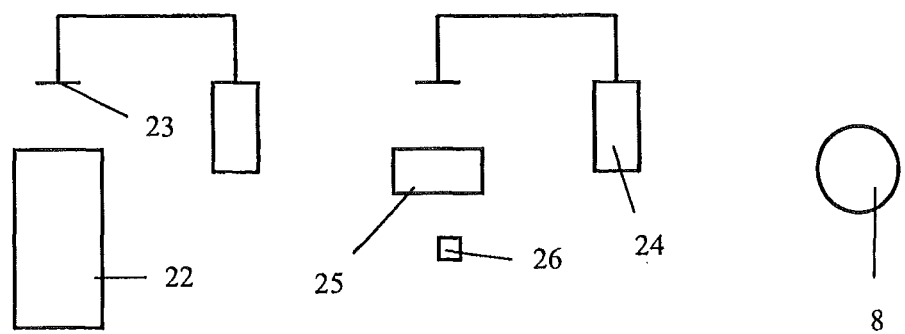
FIG. 6 is a sketch in side view of an alternative preparation table of the present invention.

In a second example indicated in FIG. 6 the transport means of the preparation device are two or more units of suction cups 23, 24. The suction cups 23, 24 are arranged turnable around a vertical axle, as indicated in FIG. 6. A person skilled in the art realises that the suction cups 23, 24 may have several different embodiments, they may for instance be plates having a relatively large number of suction openings. A first suction cup 23 collects the cut printing plates 5 from the top of a plate magazine 22. The printing plates 5 are then placed on a preparation table 25 for back exposure from a light source 26 placed below the preparation table 25. After back exposure the printing plate 5 is moved from the preparation table 25 to the upper side of the printing sleeve 8 by a further suction cup 24. The printing plates 5 are placed on the printing sleeve 5 in the desired positions.

Figure 7:
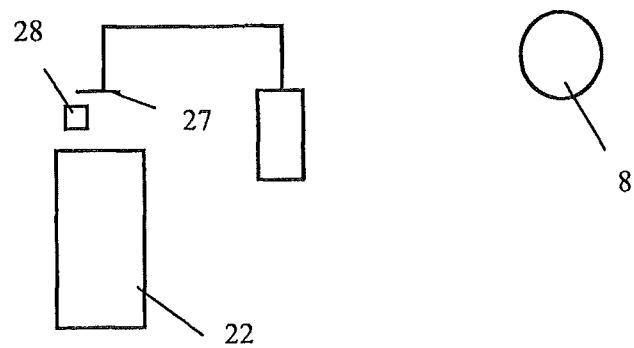
FIG. 7 is a sketch in side view of a further alternative preparation table of the present invention.

In a third example indicated in FIG. 7 the uppermost printing plate 5 of a plate magazine 22 is back exposed directly in the plate magazine 22. Thus, in this case the printing plates 5 are placed upside down in the stacks of the plate magazine 22, compared to the other shown embodiments, and a light source 28 is placed above the plate magazine 22. After the back exposure the printing plate 5 is gripped by a suction cup 27 and transferred to the printing sleeve 8. In the same way as described above in connection with FIG. 6 the suction cup 27 is turnable around a vertical axle. In this case the printing plates 5 are placed on the lower side of the printing sleeve 8.

In both embodiments of FIG. 6 and FIG. 7 the printing plates 5 of the stack of the plate magazine 22, each has a cover on the side not to be back exposed, for protection. The cover of the printing plate 5 is removed before the printing plate 5 is placed on the printing sleeve 8. The cover is removed by means of a suction cup in one example.

When the printing plates 5 have been placed on the printing sleeve 8 it is treated the same way independently of which of the above different embodiments of preparation devices that are used.

The printing sleeves 8 may be placed in a revolving magazine 10. The number of sleeves in the revolving magazine may vary from two and upwards. In the shown example there are only two printing sleeves 8 in the magazine 10. With two printing sleeves 8 in the magazine 10 a finished printing sleeve 8 may be taken out and a new printing sleeve 8 may be placed in the magazine during the time a further printing sleeve 8 is furnished with printing plates 5.

The speed of the transportation means 3, the feeding mechanism for feeding printing plates 5 from the plate magazine 2, the rotation of the printing sleeve 8 and rotation of the revolving magazine 10 for the printing sleeves 8 are all controlled and adapted to each other. The control of the different parts is normally done by means of a computer. The control and adaptation to e.g. size and number is based on the actual printing plates 5 to be prepared at a certain point of time.

The sleeve 8 with the printing plates is then moved to a CtS device 18 for imaging and integrated main exposure to UV light. After the main exposure the printing plates 5 on the sleeve 8 are round processed in a normal way, by washing 19, drying 20 and possible further final processing.

Finally the printing sleeve 8 is placed in a printing machine for use.

The invention claimed is:

1. A method of preparing a printing form for flexographic printing, comprising steps performed in the following order
    stacking pre-cut blank printing plates in stacks,
    either automatically taking the printing plates from the stacks and placing the printing plates on a preparation table for preparing and positioning before fixing onto a printing sleeve or a printing cylinder and then subjecting the printing plates to back exposure on the preparation table, or subjecting the printing plates to back exposure in the stacks,
    automatically transferring and fixing the printing plates onto the printing sleeve or printing cylinder,
    providing the printing sleeve or printing cylinder with the printing plates at an imager with integrated main exposure, and
    round processing the printing sleeve or printing cylinder with the printing plates.

2. The method of claim 1, wherein the cut printing plates are placed in a plate magazine and the printing plates are delivered in a predetermined order from the plate magazine onto the preparation table, which predetermined order is adapted to an intended placement of the printing plates on the printing sleeve.

3. The method of claim 1, wherein the printing plates are brought from the preparation table to the printing sleeve or printing cylinder by a transportation means of the preparation table, while the printing sleeve or printing cylinder is rotated with a speed adapted to a speed of the transportation means in such a way that the printing plates are placed in register in predetermined positions on the printing sleeve or printing cylinder, and wherein the printing plates are placed staggered in two or more lanes on the printing sleeve or printing cylinder.

4. The method of claim 3, wherein the transportation means of the preparation table is a conveyor belt.

5. The method of claim 4, wherein the printing plates pass a light source for the back exposure, which light source is below a part of the conveyor belt carrying the printing plates.

6. The method of claim 3, wherein the transportation means of the preparation table are one or more units of suction cups received turnable around a vertical axle.

7. The method of claim 1, wherein the subjecting of the printing plates to the back exposure comprises use of a light source for the back exposure that is placed below the printing plates on the preparation table.

8. The method of claim 1, wherein a light source for back exposure is above the plate magazine for exposure of an uppermost printing plate of the plate magazine.

9. The method of claim 1, wherein the printing plates are fixed to the printing sleeve or printing cylinder using tape with adhesive on both sides or sleeves with an adhesive surface.

10. The method of claim 1, wherein the imaging of the printing sleeve or printing cylinder includes laser ablation to create a negative of the printing pattern and subsequent exposure to UV light and wherein the round processing of the printing sleeve or printing cylinder includes at least washing and drying.

11. A system used in a method of preparing a printing form for flexographic printing, comprising:
   a plate magazine receiving printing plates;
   a unit for back exposure to light;
   a printing sleeve or printing cylinder;
   means for automatically transferring and fixing the printing plates to the printing sleeve or printing cylinder in a pre-determined order;
   imaging means for creating a negative image of the print pattern on the printing plates on the printing sleeve or printing cylinder;
   means for main exposure of the negative image; and
   round processing means to form a relief print pattern on the printing plates on the printing sleeve or printing cylinder, to obtain said printing form.

12. The system of claim 11, further comprising a preparation table, and means for transport transporting printing plates onto the preparation table and from the preparation table onto the printing sleeve or printing cylinder.

13. The system of claim 12, wherein a revolving magazine for printing sleeves or printing cylinder is placed at one end of the preparation table, which end is at a downstream end of the table and the transportation means.

14. The system of claim 13, wherein the revolving magazine holds two or more printing sleeves or printing cylinder.

15. The system of claim 12, wherein an upper surface of the preparation table is an upper part of a conveyor belt as the transportation means for bringing the printing plates from the upstream end of the preparation table to the printing sleeve or printing cylinder.

16. The system of claim 15, wherein a number of stabilizing rollers are above the upper part of the conveyor belt, wherein the stabilizing rollers are at a height above the conveyor belt adapted to a thickness of the printing plates and wherein the light source for back exposure is below the upper part of the conveyor belt.

17. The system of claim 15, wherein a guide bar is arranged between the plate magazine and the conveyor belt.

18. The system of claim 15, wherein a feeding roller is above a transition between the conveyor belt and a revolving magazine.

19. The system of claim 15, wherein a guide bar is arranged between the conveyor belt and the printing sleeve or printing cylinder positioned to receive the printing plates.

20. The system of claim 11, wherein the printing plates are placed in several different stacks in the plate magazine.

21. The system of claim 20, wherein the plate magazine has means for delivering printing plates from different stacks to the preparation table.

22. The system of claim 21, wherein the means for delivering printing plates from each stack is a friction roll placed below a lowermost printing plate of the stack, which lowermost printing plate is fed out under a mechanical stop hindering the printing plate above the lowermost printing plate from being fed out with the lowermost printing plate.

23. The system of claim 11, wherein the unit for back exposure comprises a UV light source for exposure of a rear side of the printing plates.

24. The system of claim 11, wherein the unit for back exposure is placed below the printing plates when placed onto, or transported on, the preparation table.

25. The system of claim 11, wherein the unit for back exposure is placed at the plate magazine.

26. The system of claim 11, wherein one or more units of suction cups moves printing plates from the plate magazine, onto the preparation table and further onto the printing sleeve or printing cylinder, which one or more units of suction cups each are arranged rotatable around a vertical axis.

27. The system of claim 11, wherein the means for automatically transferring and fixing the printing plates to the printing sleeve or the printing cylinder includes a conveyor positioned beneath the plate magazine which transports the printing plates from the plate magazine to the printing sleeve or the printing cylinder.

28. A system for preparing a flexographic printing form comprising:
   a magazine configured to house a plurality of printing plates stacked in more than one column;
   a printing sleeve or printing cylinder possessing an outer circumferential surface fixable to the printing plates;
   a conveyor configured to transport the printing plates from the columns of the magazine to the printing sleeve or the printing cylinder;
   a light source configured to expose an underside of the printing plates to light;
   an imaging device configured to create a negative image of a print pattern on a topside of the printing plates after the printing plates are fixed to the printing sleeve or the printing cylinder, and expose the negative image of the print pattern to light; and
   a round processor configured to form a relief print pattern on the printing plates after the printing plates are fixed to the printing sleeve or the printing cylinder.

29. The system of claim 28, wherein a transport speed of the conveyor is synchronizable with a rotational speed of the printing sleeve or the printing cylinder.

30. The system of claim 28, wherein the conveyor transports printing plates from respective columns of the magazine to different axial positions along the printing sleeve or the printing cylinder.

* * * * *